United States Patent
Tanaka et al.

(10) Patent No.: US 10,627,568 B2
(45) Date of Patent: Apr. 21, 2020

(54) PLANAR ILLUMINATION DEVICE AND METHOD OF MANUFACTURING PLANAR ILLUMINATION DEVICE

(71) Applicant: MINEBEA MITSUMI Inc., Nagano (JP)

(72) Inventors: Kazuhiro Tanaka, Fukuroi (JP); Tomohisa Shimode, Iwata (JP); Takashi Edamitsu, Fukuroi (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

(21) Appl. No.: 15/828,648

(22) Filed: Dec. 1, 2017

(65) Prior Publication Data
US 2018/0164484 A1    Jun. 14, 2018

(30) Foreign Application Priority Data

Dec. 13, 2016 (JP) ................................ 2016-241565
Mar. 16, 2017 (JP) ................................ 2017-051366

(51) Int. Cl.
*F21V 7/04* (2006.01)
*F21V 8/00* (2006.01)
(Continued)

(52) U.S. Cl.
CPC ........... *G02B 6/009* (2013.01); *G02B 6/0051* (2013.01); *G02B 6/0053* (2013.01);
(Continued)

(58) Field of Classification Search
CPC .. G02B 6/0055; G02B 6/0068; G02B 6/0071; G02B 6/0073
(Continued)

(56) References Cited

U.S. PATENT DOCUMENTS

| 2010/0053493 | A1* | 3/2010 | Kuwajima | ........... G02B 6/0068 349/58 |
|---|---|---|---|---|
| 2013/0229596 | A1* | 9/2013 | Hosoki | ................... F21V 21/00 349/65 |
| 2013/0320371 | A1 | 12/2013 | Sugizaki et al. | |
| 2014/0217456 | A1 | 8/2014 | Ann et al. | |
| 2014/0340431 | A1* | 11/2014 | Yamakawa | .......... G09G 3/3426 345/690 |
| 2016/0150604 | A1* | 5/2016 | Grajcar | ............. H05B 33/0809 315/122 |

(Continued)

FOREIGN PATENT DOCUMENTS

| JP | 61-79293 A | 4/1986 |
|---|---|---|
| JP | 08-130363 A | 5/1996 |

(Continued)

OTHER PUBLICATIONS

Notification of Reasons for Refusal dated Apr. 16, 2019 for corresponding Japanese Application No. 2017-051366 and English translation.

*Primary Examiner* — Daniel St Cyr
(74) *Attorney, Agent, or Firm* — Pearne & Gordon LLP

(57) ABSTRACT

A planar illumination device according to an embodiment includes a light guide plate, a light source, a substrate, and a fixing member. The light guide plate causes light incident on a side surface to exit from a light exit surface. The light source is arranged on a side of the side surface of the light guide plate and has a light emitting surface to emit light toward the side surface. The light source is mounted on the substrate by bonding a bonding surface of the light source thereto by a solder. The fixing member is cured at temperature lower than a melting point of the solder and fixes the light source to the substrate while maintaining a position and a posture of the light source.

17 Claims, 9 Drawing Sheets

(51) Int. Cl.
    *H01L 25/075*     (2006.01)
    *H01L 33/62*     (2010.01)
    *H01L 33/58*     (2010.01)
    *H01L 23/538*     (2006.01)

(52) U.S. Cl.
    CPC ......... *G02B 6/0055* (2013.01); *G02B 6/0065* (2013.01); *G02B 6/0083* (2013.01); *G02B 6/0068* (2013.01); *G02B 6/0073* (2013.01); *G02B 6/0091* (2013.01); *H01L 23/5387* (2013.01); *H01L 25/0753* (2013.01); *H01L 33/58* (2013.01); *H01L 33/62* (2013.01); *H01L 2933/0066* (2013.01)

(58) Field of Classification Search
    USPC .................. 362/613, 611, 619, 620, 623, 629
    See application file for complete search history.

(56) References Cited

U.S. PATENT DOCUMENTS

| | | | |
|---|---|---|---|
| 2016/0150640 A1* | 5/2016 | Sugawara | H05K 1/0274 362/612 |
| 2016/0205785 A1 | 7/2016 | Kieslinger et al. | |
| 2017/0371095 A1* | 12/2017 | Tokunaga | G02B 6/0088 |
| 2018/0059313 A1* | 3/2018 | Furuta | G02B 6/0068 |

FOREIGN PATENT DOCUMENTS

| | | |
|---|---|---|
| JP | 2001-160312 A | 6/2001 |
| JP | 2013-251493 A | 12/2013 |
| JP | 2016-530723 A | 9/2016 |
| JP | 2017-163029 A | 9/2017 |
| WO | 2015/031928 A1 | 3/2015 |

* cited by examiner

PLANAR ILLUMINATION DEVICE AND METHOD OF MANUFACTURING PLANAR ILLUMINATION DEVICE

CROSS-REFERENCE TO RELATED APPLICATIONS

The present application claims priority to and incorporates by reference the entire contents of Japanese Patent Application No. 2016-241565 filed in Japan on Dec. 13, 2016 and Japanese Patent Application No. 2017-051366 filed in Japan on Mar. 16, 2017.

BACKGROUND OF THE INVENTION

1. Field of the Invention

The present invention relates to a planar illumination device and a method of manufacturing the planar illumination device.

2. Description of the Related Art

There is a planar illumination device in which a light emitting diode (LED) mounted on a substrate by a solder, such as a top view type LED and a side view type LED, is arranged so as to face a light incident surface of a light guide plate.

Conventionally, a technique of self-alignment for correcting misalignment or inclination (a posture change) of an LED caused by melting of a solder in the case of soldering the LED has been known.

In recent years, a light guide plate has become thinner relative to the thickness of the top view type LED along with a demand for narrowing of a frame of a planar illumination device. Even under such a circumstance, it is necessary to align the LED and the light guide plate with high accuracy in order to obtain sufficient brightness characteristics, and accordingly, it is necessary to mount the LED on the substrate with high accuracy.

In the above-described conventional technique, however, the mounting accuracy of the LED deteriorates due to the action of self-alignment, and accordingly, there is a case where it is difficult to obtain the sufficient brightness characteristics.

SUMMARY OF THE INVENTION

It is an object of the present invention to at least partially solve a problem in a conventional technology.

According to an aspect of the present invention, there is provided a planar illumination device, including a light guide plate that causes light incident on a side surface to exit from an light exit surface, a light source that is arranged on a side of the side surface of the light guide plate and has a light emitting surface to emit light toward the side surface, a substrate on which the light source is mounted by bonding a bonding surface of the light source thereto by a solder, and a fixing member that is cured at temperature lower than a melting point of the solder and fixes the light source to the substrate while maintaining a position and a posture of the light source.

DETAILED DESCRIPTION OF THE PREFERRED EMBODIMENT

Figure 1:
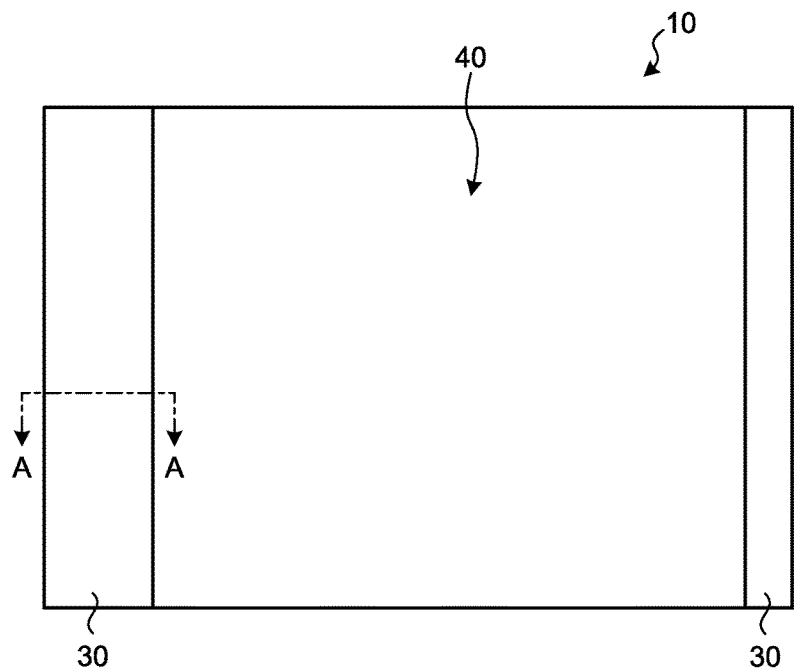
FIG. 1 is a top view illustrating an example of an appearance of a planar illumination device according to an embodiment.

Hereinafter, a planar illumination device and a manufacturing method thereof according to an embodiment will be described with reference to the drawings. Herein, a dimensional relationship among respective elements, a ratio of respective elements, and the like in the drawings may differ from those in the reality in some cases. Parts that are different in a dimensional relationship and a ratio among the drawings may be included in the drawings.

Overview of Planar Illumination Device

First, an overview of a planar illumination device 10 will be described with reference to FIG. 1. FIG. 1 is a top view illustrating an example of an appearance of the planar illumination device 10 according to an embodiment. As illustrated in FIG. 1, the planar illumination device 10 according to the embodiment causes light to exit from an effective area 40 which is an exit area that is not covered by a light shielding sheet 30. That is, the effective area 40 is defined by the light shielding sheet 30.

The planar illumination device 10 according to the embodiment is used as a backlight of a liquid crystal display device. Such a liquid crystal display device is used, for example, in a smartphone.

Herein, the light shielding sheet 30 on the left side has a larger width than the light shielding sheet 30 on the right side in FIG. 1. This is because the light shielding sheet 30 on the right side covers a comparatively narrow area that does not include a light source 14 or a substrate (see FIG. 2) to be described later while the light shielding sheet 30 on the left side covers a comparatively wide area that includes the light source 14, the substrate 12, and the like.

The width of the light shielding sheet 30 on the left side is, for example, 1.5 mm. In addition, a light shielding sheet 31 (see FIG. 2) to be described later is not illustrated in FIG. 1. Hereinafter, the light shielding sheet 30 will be referred to as a "first light shielding sheet 30", and the light shielding sheet 31 will be referred to as a "second light shielding sheet 31" in order to distinguish the light shielding sheet 30 from the light shielding sheet 31.

Detailed Configuration of Planar Illumination Device

Figure 2:
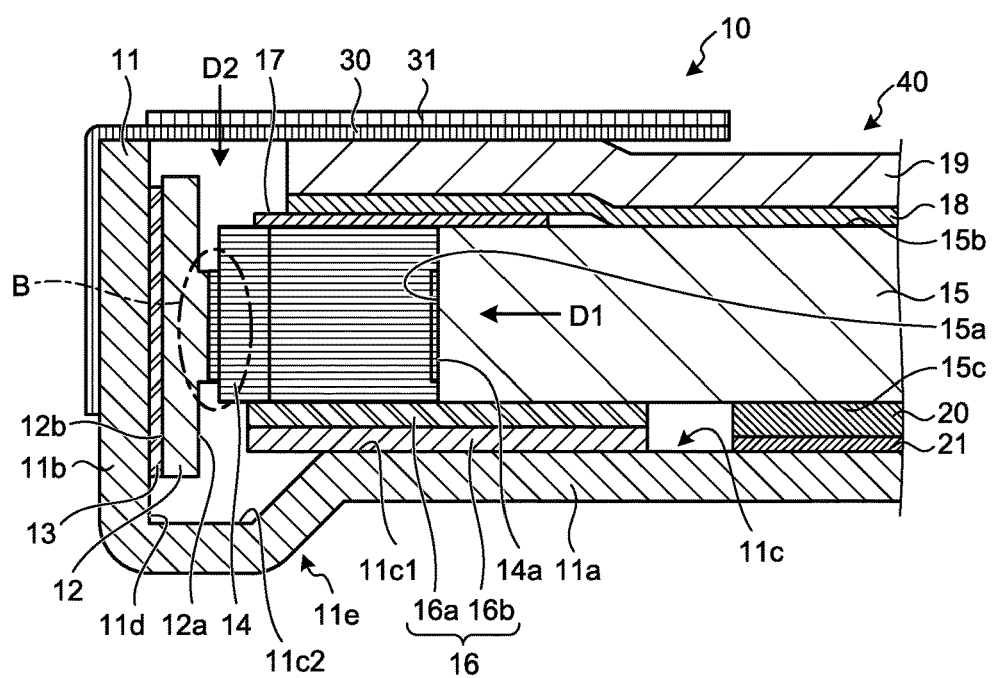
FIG. 2 is a cross-sectional view taken along line A-A of FIG. 1.

Next, a detailed configuration of the planar illumination device 10 will be described with reference to FIG. 2. FIG. 2 is a cross-sectional view taken along line A-A of FIG. 1. As illustrated in FIG. 2, the planar illumination device 10 includes a frame 11, a flexible printed circuit (FPC) which is the substrate 12 (hereinafter, referred to as the FPC 12), a connection member 13, an LED which is the light source 14 (hereinafter, referred to as the LED 14), a light guide plate 15, a coupling member 16, a connection member 17, a diffusion sheet 18, a prism sheet 19, a reflection sheet 20, the first light shielding sheet 30, and the second light shielding sheet 31.

The frame 11 is a member that contains the FPC 12, the connection member 13, the LED 14, the light guide plate 15, the coupling member 16, the connection member 17, the diffusion sheet 18, and the prism sheet 19. The frame 11 is, for example, a sheet-metal frame made of stainless steel having high rigidity and light reflectance. The frame 11 has a bottom portion 11a and a side wall portion 11b.

The bottom portion 11a is a portion that extends along a back surface 15c, which will be described later, of the light guide plate 15. The bottom portion 11a has a floor surface 11c. The floor surface 11c has a flat surface 11c1 and a concave surface 11c2 formed in a concave portion 11e to be described later. The LED 14 and the light guide plate 15 are placed on the flat surface 11c1 among those surfaces.

The side wall portion 11b is a portion that rises along a long side of a side surface 15a, which will be described later, of the light guide plate 15 in a direction in which the light exits (a normal direction of the flat surface 11c1 of the floor surface 11c) in an integrated manner from the bottom portion 11a. The side wall portion 11b has a side surface 11d.

In addition, the concave portion 11e is formed on the bottom portion 11a. The concave portion 11e is a portion that is formed to be concave in a direction opposite to the direction in which the light exits from a portion of the floor surface 11c on the side surface 11d side along the side surface 11d and releases a lower end portion of the FPC 12. A width of the concave portion 11e is formed to be narrow such that the coupling member 16 that is larger is arranged on the flat surface 11c1 of the floor surface 11c. The concave portion 11e has the concave surface 11c2 on a bottom portion thereof.

The FPC 12 is the substrate which has two main surfaces 12a and 12b and the LED 14 is mounted on the main surface 12a. The FPC 12 is, for example, a polyimide substrate. A predetermined wiring pattern (not illustrated) is formed on the FPC 12, and power from an external power source (not illustrated) is supplied to the LED 14 via the wiring pattern so that the LED 14 can emit light.

The connection member 13 is a member that fixes the FPC 12 to the side surface 11d of the frame 11. The connection member 13 is, for example, a double-sided tape. The FPC 12 is fixed to the side surface 11d by bonding one surface of the connection member 13 to the main surface 12b opposite to the main surface 12a of the FPC 12 and bonding the other surface of the connection member 13 to the side surface 11d.

The LED 14 is a point-like light source (point light source). The LED 14 is, for example, a pseudo white LED composed of a blue LED and a yellow phosphor. The LED 14 is formed in a rectangular parallelepiped shape as a whole and has a light emitting surface 14a that emits light toward the side surface 15a of the light guide plate 15. The LED 14 is mounted on the FPC 12 as a surface (bonding surface) other than the light emitting surface 14a is bonded by a solder. The LED 14 is, for example, a so-called top view type LED having the light emitting surface 14a on a surface opposite to the surface that is mounted on the FPC 12.

In the embodiment, a plurality of the LEDs 14 are provided. In addition, the plurality of LEDs 14 are arranged side by side along a long-side direction of the side surface 15a in a state where the light emitting surface 14a thereof faces the side surface 15a of the light guide plate 15. Further, the plurality of LEDs 14 emit light toward the side surface 15a. In this manner, the plurality of LEDs 14 emit the light that is incident on the side surface 15a.

In addition, the LED 14 is mounted on the FPC 12 by being soldered to the FPC 12 in a part B of FIG. 2. Simultaneously, the LED 14 is fixed to the FPC 12. Herein, a detailed configuration (a fixing structure of LED 14) in the part B will be described later with reference to FIGS. 3A and 3B.

The light guide plate 15 is formed in a flat plate shape using a transparent material (for example, a polycarbonate resin). The light guide plate 15 has the side surface 15a, a main surface 15b, and the back surface 15c on an outer surface thereof.

The side surface 15a is an incident surface on which the light emitted from the light emitting surface 14a of the LED 14 is incident. The main surface 15b is a light exit surface from which the light incident on the side surface 15a exits toward the outside. Further, an optical path changing pattern composed of a plurality of dots, for example, is formed on the back surface 15c which is a surface opposite to the main surface 15b.

As such an optical path changing pattern is formed, a travel direction of light traveling inside the light guide plate 15 is changed, and the light efficiently exits from the main surface 15b. That is, the planar illumination device 10 according to the embodiment is a so-called edge light type illumination device.

The coupling member 16 is a member that is arranged between a set of the LED 14 and the light guide plate 15 and the flat surface 11c1 of the floor surface 11c and optically and mechanically couples the light guide plate 15 with the LED 14.

Specifically, the coupling member 16 couples the light emitting surface 14a of the LED 14 with the side surface 15a of the light guide plate 15 in a state where an optical axis of the LED 14 coincides with an optical axis of the light guide plate 15. The coupling member 16 is, for example, a strip-shaped single-sided tape, and has a base material 16a and a fixing member 16b. That is, the coupling member 16 is the member that can be bonded only on the fixing member 16b side.

The base material 16a is, for example, a resin such as PET. The fixing member 16b is, for example, a resin such as silicon and an acrylic, and forms an adhesive layer. The fixing member 16b adheres to at least a part of the back surface 15c of the light guide plate 15 close to the LED 14 and adheres to at least a part of a surface of the LED 14 on the floor surface 11c side close to the light guide plate 15.

That is, at least a part of the back surface 15c of the light guide plate 15 and at least a part of the surface of the LED 14 on the floor surface 11c side are attached to the coupling member 16. Accordingly, the coupling member 16 can couple the side surface 15a of the light guide plate 15 with the light emitting surface 14a of the LED 14.

Here, if the coupling member 16 is a double-sided tape, the light guide plate 15 and the LED 14 are fixed to the floor surface 11c. Thus, there is a risk that the light guide plate 15 and the LED 14 hardly release an external force and are damaged when the external force is applied to the planar illumination device 1. Since the coupling member 16 is the single-sided tape in the embodiment, the light guide plate 15 and the LED 14 are not fixed to the floor surface 11c so that the light guide plate 15 and the LED 14 can release the external force. Therefore, it is possible to suppress occurrence of damage of the LED 14 and the light guide plate 15 according to the embodiment.

In addition, the coupling member 16 has a member that absorbs light or a member that reflects light. For example, when the coupling member 16 has the member that reflects light, the light from the light emitting surface 14a of the LED 14 is reflected to return to the light guide plate 15, and thus, it is possible to improve the brightness.

Herein, even when a thickness of the LED 14 and a thickness of the light guide plate 15 are different, for example, when the thickness of the light guide plate 15 is greater than the thickness of the LED 14, it is possible to cause the surface of the LED 14 on the floor surface 11c side and the back surface 15c of the light guide plate 15 to flush with each other and to couple the LED 14 with the light guide plate 15 using the coupling member 16. Therefore, it is possible to stabilize the light coupling efficiency between the LED 14 and the light guide plate 15 using the coupling member 16 according to the embodiment.

The connection member 17 is a member that is arranged on the opposite side of the coupling member 16 with respect to the LED 14 and the light guide plate 15, and optically and mechanically couples the LED 14 with the light guide plate 15. Specifically, the connection member 17 couples the light emitting surface 14a of the LED 14 with the side surface 15a of the light guide plate 15. The connection member 17 is arranged between the diffusion sheet 18, which will be described later, and a set of the LED 14 and the light guide plate 15.

The connection member 17 is, for example, a double-sided tape, and one surface thereof is bonded to at least a part of a surface of the LED 14, opposite to the floor surface 11c and close to the light guide plate 15 and is bonded to at least a part of the main surface 15b of the light guide plate 15 close to the LED 14.

That is, at least a part of the surface of the LED 14 opposite to the floor surface 11c and at least a part of the main surface 15b of the light guide plate 15 are attached to the connection member 17. Accordingly, the connection member 17 can couple the light emitting surface 14a of the LED 14 with the side surface 15a of the light guide plate 15.

In addition, the other surface of the connection member 17 is bonded to at least a part of the diffusion sheet 18 on the side wall portion 11b side. Accordingly, the connection member 17 fixes the diffusion sheet 18 to the light guide plate 15 so that it is possible to suppress floating of the diffusion sheet 18 from the light guide plate 15. Therefore, it is possible to suppress degradation in brightness characteristics such as brightness and brightness distribution of light exiting from the effective area 40 according to the embodiment.

The diffusion sheet 18 is a member that is arranged on the main surface 15b side of the light guide plate 15 and diffuses the light exiting from the main surface 15b. Specifically, the diffusion sheet 18 is arranged so as to cover at least a part of the main surface 15b and the surface of the LED 14 opposite to the floor surface 11c.

The prism sheet 19 is a member that is arranged on a side opposite to the light guide plate 15 with respect to the diffusion sheet 18, performs light distribution control of light diffused by the diffusion sheet 18, and causes the light that has been subjected to the light distribution control to exit.

The reflection sheet 20 is a member that reflects light leaking from the back surface 15c of the light guide plate 15 and causes the light to return to the light guide plate 15 again. The reflection sheet 20 is arranged between the back surface 15c of the light guide plate 15 and the floor surface 11c in the state of being fixed on the flat surface 11c1 of the floor surface 11c by a double-sided tape 21.

The double-sided tape 21 is, for example, a white tape and one surface of which is bonded to a part of the reflection sheet 20 and the other surface of which is bonded to the flat surface 11c1 of the floor surface 11c. Accordingly, the reflection sheet 20 is fixed onto the floor surface 11c.

The first light shielding sheet 30 is a member that defines the effective area 40 from which light exits from the planar illumination device 10 by being arranged so as to cover a part of the side wall portion 11b side of the prism sheet 19 and shielding against light exiting from a part of the main surface 15b of the light guide plate 15.

For example, the first light shielding sheet 30 is a single-sided tape that is capable of shielding against light, and a portion on one end side thereof is bonded to an outer surface of the side wall portion 11b of the frame 11. In addition, a surface on the prism sheet 19 side of a portion on the other end side of the first light shielding sheet 30 is bonded to a part of the side wall portion 11b side of the prism sheet 19.

The second light shielding sheet 31 is arranged so as to cover the first light shielding sheet 30. The second light shielding sheet 31 is, for example, a double-sided tape that is capable of shielding against light. One surface between two surfaces of the second light shielding sheet 31 is bonded to the portion on the other end side of the first light shielding sheet 30, and the other surface is bonded to the liquid crystal display device (not illustrated), which uses the planar illumination device 10 as the backlight, or the like. Accordingly, it is possible to fix the planar illumination device 10 to the liquid crystal display device or the like.

Herein, in the case of providing the plurality of LEDs, it is necessary to mount the plurality of LEDs on the FPC while being aligned with high accuracy such that the light emitting surfaces thereof correspond to a shape of the side surface (light incident surface) of the light guide plate. In this case, self-alignment generally acts to correct misalignment or inclination (a posture change) of the LED caused by melting of the solder.

However, there is a case where it is difficult for the self-alignment to obtain desired mounting accuracy along with the high performance of the planar illumination device. In particular, an aspect ratio of an LED tends to increase (become one or higher) and the weight decreases as the planar illumination device becomes thinner, and thus, the LED is likely to be inclined or misaligned at the time of reflow of the solder so that the mounting accuracy of the LED decreases. When the mounting accuracy of the LED decreases, it adversely affects the brightness characteristics (optical characteristics such as brightness and brightness distribution).

In the embodiment, when mounting the LED 14 on the FPC 12, the action of self-alignment is restricted so that the LED 14 is fixed to the FPC 12 while maintaining a position and a posture. Thus, the planar illumination device 10 further includes a fixing member 51 (see FIGS. 3A to 3C) to be described later.

Fixing Structure of LED

Figure 3A:
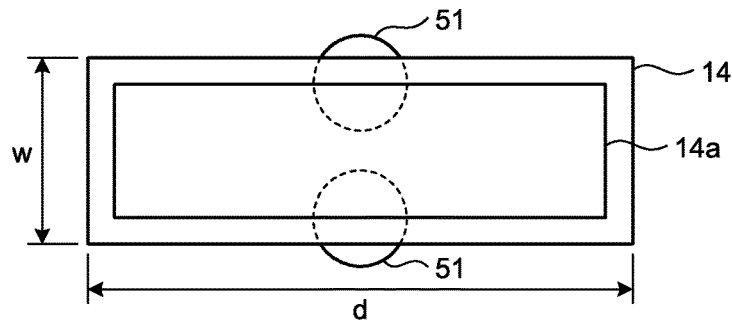
FIG. 3A is a schematic view (Part 1) illustrating a light source mounted on a substrate.
Figure 3B:
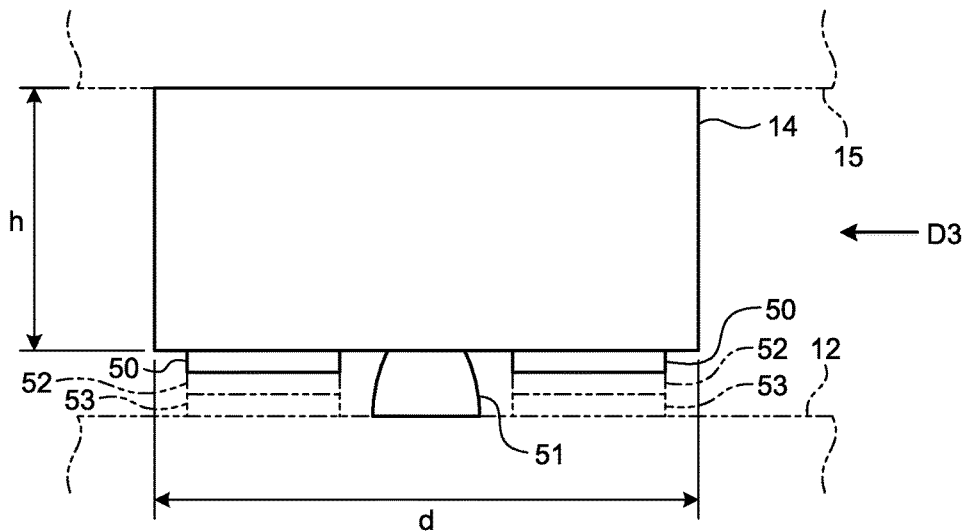
FIG. 3B is a schematic view (Part 2) illustrating the light source mounted on the substrate.
Figure 3C:
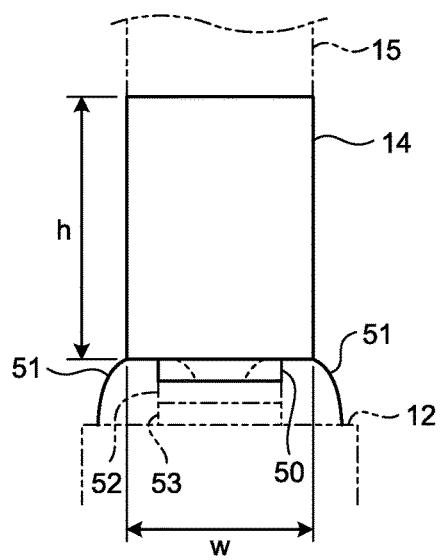
FIG. 3C is a schematic view (Part 3) illustrating the light source mounted on the substrate.

Hereinafter, a fixing structure to fix the LED 14 to the FPC 12 with high accuracy will be described with reference to FIGS. 3A to 3C. FIGS. 3A to 3C are schematic views illustrating the light source (LED) 14 mounted on the substrate (FPC) 12. Herein, FIG. 3A illustrates a side surface (viewed in a direction of an arrow D1 in FIG. 2) of the LED 14 in the mounted state, FIG. 3B illustrates a top surface (viewed in a direction of an arrow D2 in FIG. 2) of the LED 14, and FIG. 3C illustrates another side surface of the LED 14 (viewed in a direction from the front of the paper towards the back or from the back to the front of the paper in FIG. 2, or viewed in a direction of an arrow D3 in FIG. 3B).

As illustrated in FIGS. 3A to 3C, the LED 14 is formed in the rectangular parallelepiped shape, and has a shape such that an aspect ratio between a height h and a width w is, for example, one or higher. For example, when it is set such that the height h=0.5 mm and the width w=0.3 mm, the aspect ratio between the height h and the width w is higher than one. Herein, the LED 14 is the rectangular parallelepiped that is set such that the height h=0.5 mm, the width w=0.3 mm, and a depth d=1.3 mm in the present embodiment.

Herein, regarding the LED 14, the "depth (d)" is a length in an arrangement direction of the LEDs 14 arranged on the FPC 12. In addition, the "height (h)" is a length of the LED 14, arranged on the FPC 12, in a direction away from the FPC 12, and the "width (w)" is a length in a direction orthogonal to each of the "depth (d)" and the "height (h)" as illustrated in FIGS. 3B and 3C.

In addition, the LED 14 has the shape in which the aspect ratio between the height h and the width w is, for example, one or higher as described above, but may have a shape in which each of aspect ratios between the height h and the width w, between the width w and the depth d, and between the depth d and the height h is, for example, one or higher.

The LED 14 is bonded to the FPC 12 to be electrically conductive with an electrode 53 provided in the FPC 12 by being bonded (soldered) by a solder 52 so as to include an electrode 50 provided on the surface opposite to the light emitting surface 14*a*. Herein, the electrode 53 of the FPC 12 may be formed to be wider in a bonding surface direction than the electrode 50 of the LED 14. A configuration of such an electrode 53 will be described later with reference to FIG. 9. In addition, the LED 14 is fixed to the FPC 12 also by the fixing member 51. The fixing member 51 fixes the LED 14 to the FPC 12 while maintaining the position and posture of the LED 14. The fixing member 51 is cured at temperature lower than a melting point of the solder 52. In addition, the fixing member 51 is preferably a thermosetting adhesive.

As illustrated in FIGS. 3A and 3C, it is preferable to arrange the fixing member 51 at two points, that is, at both end portions in a thickness direction at substantially the center in a longitudinal direction on the surface of the LED 14 opposite to the light emitting surface 14*a*. Herein, the longitudinal direction is a direction of the depth d of the LED 14 arranged on the FPC 12 as illustrated in FIG. 3A, and the thickness direction is a direction of the width w of the LED 14 arranged on the FPC 12 as illustrated in FIG. 3C. Herein, the fixing member 51 is not necessarily separated, and may be arranged at a plurality of points at the time of manufacturing and arranged as a continuous body at one point after completion of a product. In addition, the fixing member 51 may be arranged in, for example, one oval shape.

In addition, it is preferable for the fixing member 51 to protrude above the FPC 12 from the surface of the LED 14 opposite to the light emitting surface 14*a* as illustrated in FIGS. 3A and 3C. Although the configuration in which the fixing member 51 protrudes from the surface of the LED 14 opposite to the light emitting surface 14*a* has been described in the present embodiment, it may be configured such that the fixing member 51 does not protrude from the surface of the LED 14 opposite to the light emitting surface 14*a*.

As described above, the fixing member 51 is cured at the temperature lower than the melting point of the solder 52 in the planar illumination device 10 according to the embodiment. That is, the fixing member 51 is cured before the solder 52 melts at the time of reflow of the solder 52. Thus, the position and posture of the LED 14 are maintained by the fixing member 51 even if the solder 52 melts. Thus, the self-alignment by the molten solder 52 does not act. Accordingly, it is possible to mount the LED 14 on the FPC 12 with high accuracy. As a result, it is possible to obtain the excellent brightness characteristics while meeting a demand for reduction in thickness.

In addition, it is possible to mount the LED 14 with high accuracy even when the LED 14 has a poorly balanced shape in terms of mounting in which the aspect ratio is one or higher. Since the fixing member 51 is arranged at the two points at both the end portions in the thickness direction at substantially the center in the longitudinal direction of the LED 14, it is possible to firmly fix the LED 14. In addition, it is possible to mount the LED 14 with high accuracy even when the LED 14 has a poorly balanced shape such that each of aspect ratios between the height h and the width w, between the width w and the depth d, and between the depth d and the height h is one or higher.

In addition, it is possible to more firmly fix the LED 14 since the fixing member 51 is the thermosetting adhesive and protrudes to the outside from the bonding surface with the FPC 12. Even if the fixing member 51 protrudes from an outer shape of the LED 14, the protruding fixing member 51 does not interfere with other members in the case of the top view type LED 14. Thus, generation of a gap between the LED 14 and the light guide plate 15, which is a concern in the case of the side view type LED, is suppressed, and a decrease in brightness caused by a decrease in light coupling ratio between the LED 14 and the light guide plate 15 is also suppressed. Further, the manufacturing becomes easy since the arrangement accuracy of the fixing member 51 is not required at the time of manufacturing.

Although the fixing member 51 is configured as a member having a thermosetting property (for example, the thermosetting adhesive) such that the fixing member 51 is cured at the temperature lower than the melting point of the solder 52 in the present embodiment, the present invention is not limited thereto. For example, the fixing member may be configured as a member having a light (for example, an ultraviolet ray) curability such that the fixing member is cured before reaching the melting point of the solder 52. For example, an ultraviolet-curable resin is preferable as the fixing member having the light curability. Even if the fixing member is made of the ultraviolet curable resin, it is possible to suppress the action of the self-alignment on the LED 14 as the fixing member is cured before reaching the melting point of the solder 52.

Configuration Example of Arrangement of Multiple LEDs

Figure 4:
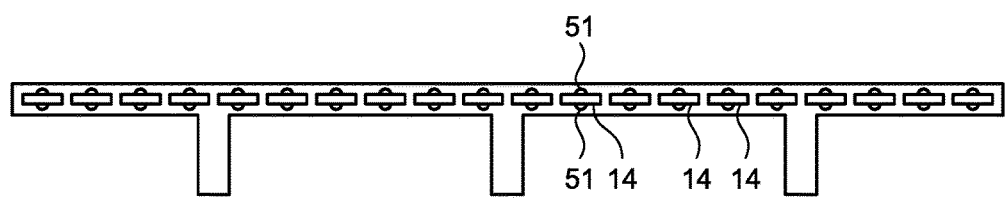
FIG. 4 is a side view illustrating a configuration example of arrangement of a plurality of light sources.

Herein, a configuration example in the case where the plurality of LEDs 14 are arranged will be described with reference to FIG. 4. FIG. 4 is a side view illustrating the configuration example of arrangement of the plurality of light sources (LEDs) 14. As described above, when the plurality of LEDs 14 are used as the light source, it is preferable to arrange the neighboring LEDs 14 and 14 to be close to each other in a straight line at a narrow pitch.

Meanwhile, when the plurality of LEDs 14 are arranged at the narrow pitch, there is no space to form a fillet of the solder 52 (see FIGS. 3B and 3C) on a pair of side surfaces in the longitudinal direction of the LED 14. Thus, it is conceivable to bond the LED 14 by reducing the amount of the solder 52, but there is a risk of leading to insufficient bonding strength. The LED 14 is fixed to the FPC 12 by the fixing member 51 in the embodiment, which is added to the bonding by the solder 52. Thus, it is possible to enhance the bonding strength of the LED 14.

In addition, for example, when the amount of the fixing member (adhesive) 51 is small at the time of manufacturing, there is a case where the height of the fixing member 51 is insufficient, and the fixing member 51 does not necessarily reach the side surface of the LED 14. Thus, a spacer (to be described later) may be provided between the fixing member 51 and the FPC 12.

Variations

Figure 5A:
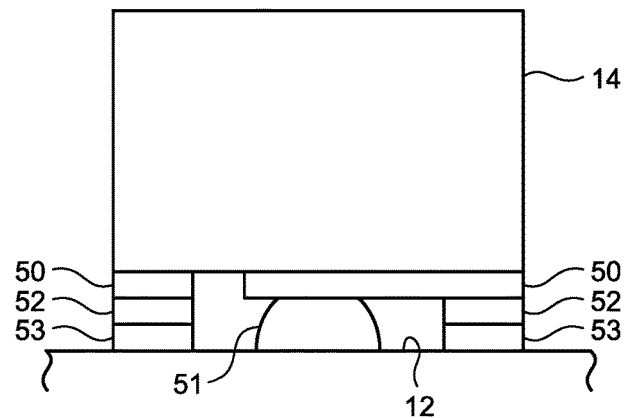
FIG. 5A is a view illustrating a first variation of a fixing structure of the light source.
Figure 5B:
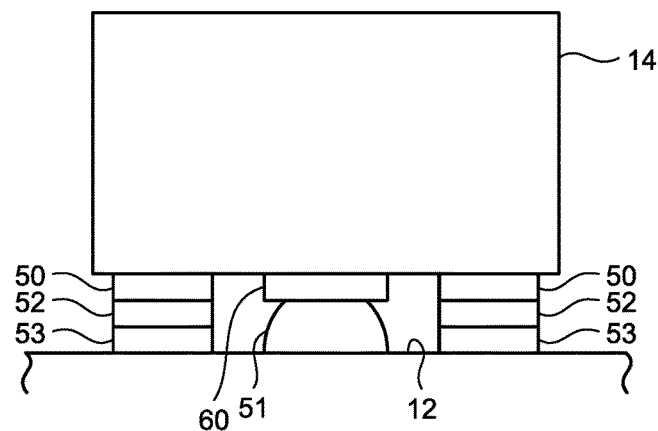
FIG. 5B is a view illustrating a second variation of the fixing structure of the light source.
Figure 5C:
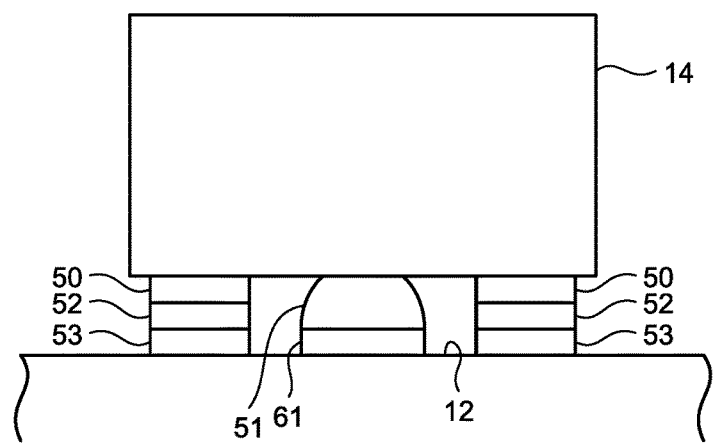
FIG. 5C is a view illustrating a third variation of the fixing structure of the light source.

Next, variations of a fixing structure of the LED 14 will be described with reference to FIGS. 5A to 5C. FIGS. 5A to 5C are views illustrating first to third variations of the fixing structure of the LED 14. Herein, FIGS. 5A to 5C illustrate a top surface of the LED 14 in the mounted state. In addition, the first to third variations illustrated in FIGS. 5A to 5C have different configurations from the above-described embodiment in that a spacer is provided. The other parts are identical to those in the embodiment, and thus, the detailed description thereof will be omitted.

As illustrated in FIG. 5A, any one of the electrodes 50 and 50 is provided to extend to the vicinity of the center on the side surface of the LED 14 in the first variation. In the first variation, even if the solder 52 is arranged between the electrode 50 on the LED 14 side and the electrode 53 on the FPC 12 side and there is a distance between the LED 14 and the FPC 12, it is possible to reach the LED 14 with the small amount of the fixing member 51. In this manner, the electrode 50 extending to the vicinity of the center functions as a spacer. In other words, the spacer is formed by extending the electrode 50. According to a configuration of the first variation, it is possible to reliably cause the fixing member 51 to reach the LED 14 even when a distance between electrodes 53 and 53 in the pair thereof is small so that only a small amount of the fixing member 51 can be applied.

As illustrated in FIG. 5B, a conductor (dummy electrode) 60 different from the electrodes 50 and 50 is provided, as a spacer, on the side surface of the LED 14 in addition to the electrodes 50 and 50 in the second variation. In other words, the spacer is formed by the dummy electrode 60. Even in the second variation, it is possible to reach the LED 14 with the small amount of the fixing member 51 even if the solder 52 is arranged between the electrode 50 on the LED 14 side and the electrode 53 on the FPC 12 side and there is the distance between the LED 14 and the FPC 12. Herein, the dummy electrode 60 does not function as an electrode. According to a configuration of the second variation, it is possible to reliably cause the fixing member 51 to reach the LED 14 even when the amount of the fixing member 51 is small, similarly to the first variation described above.

In addition, a spacer may be provided on the FPC 12 side. As illustrated in FIG. 5C, a conductor (for example, a copper foil patterned on the FPC 12) 61, different from the electrodes 53 and 53, functions as the spacer on the surface of the FPC 12 on which the LED is mounted in the third variation. In other words, the spacer is formed by the conductor (copper foil) 61 different from the electrodes 53 and 53. Even in the third variation, it is possible to reach the LED 14 with the small amount of the fixing member 51 even if the solder 52 is arranged between the electrode 50 on the LED 14 side and the electrode 53 on the FPC 12 side and there is the distance between the LED 14 and the FPC 12. According to a configuration of the third variation, it is possible to reliably cause the fixing member 51 to reach the LED 14 even when the amount of the fixing member 51 is small, similarly to the first and second variations described above.

In addition, for example, a coverlay film, which is a protective film covering the surface of the FPC 12, may be configured to function as a spacer between the fixing member 51 and the FPC 12 in addition to the configurations described above. Even with such a configuration, it is possible to reliably cause the fixing member 51 to reach the LED 14 even when the amount of the fixing member 51 is small, similarly to the first to third variations described above.

LED Mounting Process

Figure 6:
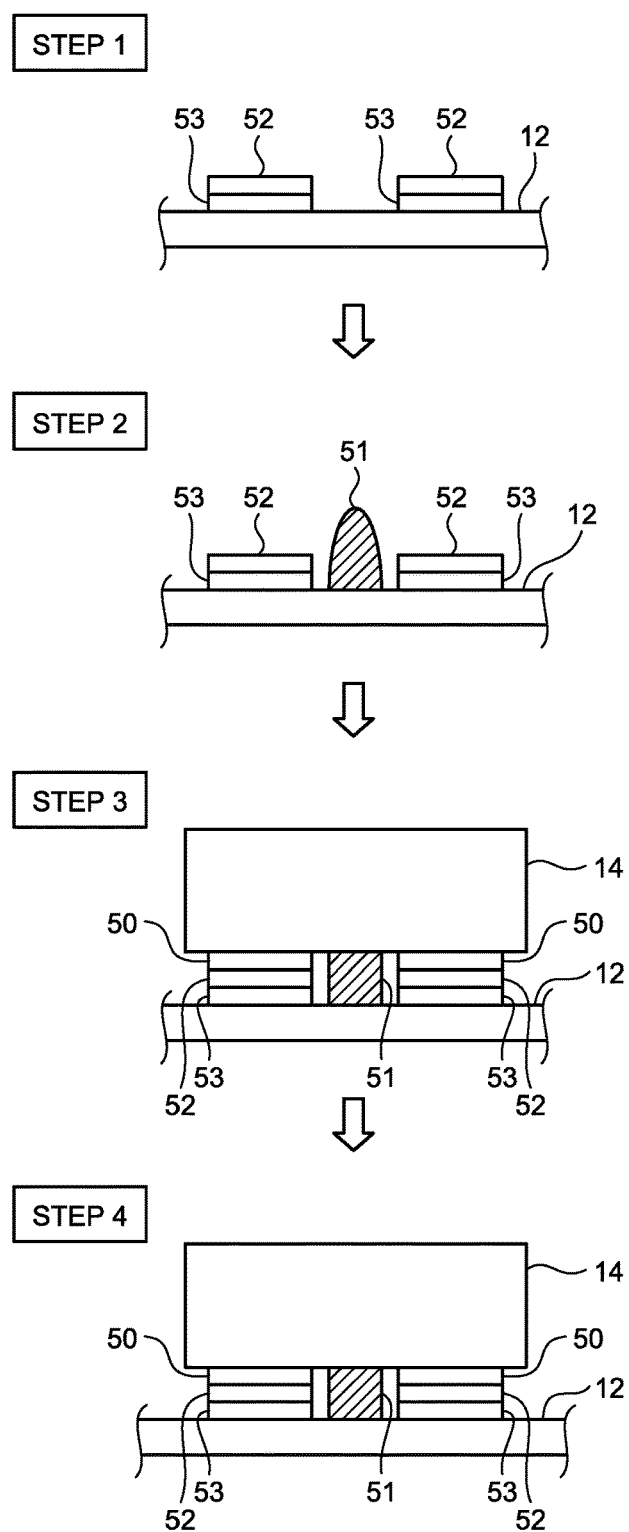
FIG. 6 is a view for explaining an example of a process of mounting the light source.

Next, a mounting (reflow) process of the LED 14 will be described with reference to FIG. 6. FIG. 6 is a view for explaining an example of the process of mounting the light source (LED) 14. Herein, FIG. 6 illustrates a top surface of the LED 14 mounted on the FPC 12. In addition, the fixing member 51 is hatched in FIG. 6 in order to emphasize the fixing member 51. As illustrated in FIG. 6, the solders 52 and 52 are printed (applied) on a mounting surface of the LED 14 in the FPC 12 in Step 1. In this case, for example, a so-called metal mask, obtained by forming an opening in a metal sheet according to a shape of the electrode 53, specifically, a shape of a land or a pad used as an electrode (hereinafter, the land or pad will be also referred to as the "electrode"), is used.

Then, the fixing member (adhesive) 51 is applied on a surface of the FPC 12 in Step 2. Herein, it is preferable to arrange the fixing member 51 on the surface of the FPC 12 so as to be positioned at the two points at the both end portions in the thickness direction at substantially the center in the longitudinal direction on the surface of the LED 14 opposite to the light emitting surface 14a after the mounting.

Then, the LED 14 is arranged on the FPC 12 while controlling the position and posture thereof in Step 3.

Then, the temperature is raised so as to be equal to or higher than the melting point of the solder 52 for reflow of the solder 52 in Step 4. Herein, the fixing member 51 has the thermosetting property to be cured at temperature lower than the melting point of the solder 52. Thus, when the temperature rises and reaches the temperature at which the fixing member 51 is cured, the fixing member 51 starts curing at a point in time when the solder 52 is turned into a semi-solid state like paste, for example.

When the temperature further rises and reaches the melting point temperature of the solder 52, the solder 52 starts melting. Although the self-alignment is about to act on the LED 14 at this stage, the self-alignment does not act on the LED 14 since the position and posture of the LED 14 are held by the fixing member 51.

As described above, the fixing member 51 is cured at temperature lower than the melting point of the solder 52 in a method of manufacturing the planar illumination device 10 according to the embodiment. That is, the fixing member 51 is cured before the solder 52 melts at the time of reflow of the solder 52. Thus, the position and posture of the LED 14 are held by the fixing member 51 even if the solder 52 melts, and the self-alignment accompanying the melting of the solder 52 does not act. Accordingly, it is possible to mount the LED 14 on the FPC 12 with high accuracy. As a result, it is possible to obtain the excellent brightness characteristics while meeting a demand for reduction in thickness.

Although the above-described Step 4, that is, the process of melting the solder 52 after curing the fixing member 51 arranged on the FPC 12 is performed using the characteristic of the fixing member 51 having the thermosetting property in the embodiment, the present invention is not limited thereto. For example, the process of melting the solder 52 after curing the fixing member arranged on the FPC 12 may be performed using a characteristic of a fixing member (for example, an ultraviolet curing resin) having light (for example, an ultraviolet ray) curability. In this case, the fixing member is cured by irradiating the fixing member or the like with the ultraviolet ray before the temperature rises to be equal to or higher than the melting point of the solder 52. Even in such a process, it is possible to suppress the action of the self-alignment on the LED 14.

Meanwhile, the amount of the solder between the LED and the FPC is insufficient as the volume of the solder decreases at the time of reflow so that the bonding between the LED and the FPC is stabilized in some cases in the LED mounting process. Thus, the solder 52 is applied to the electrode 53 of the FPC 12 so as to stabilize the bonding between the LED 14 and the FPC 12 in Step 1 in FIG. 6, that is, the process of applying the solder 52 in the embodiment.

Example of Solder Application Method

Figure 7:
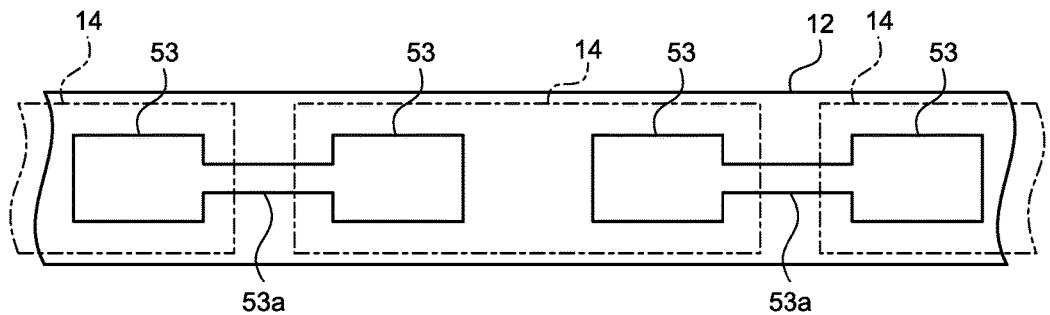
FIG. 7 is a view illustrating an example of an electrode of the substrate.
Figure 8:
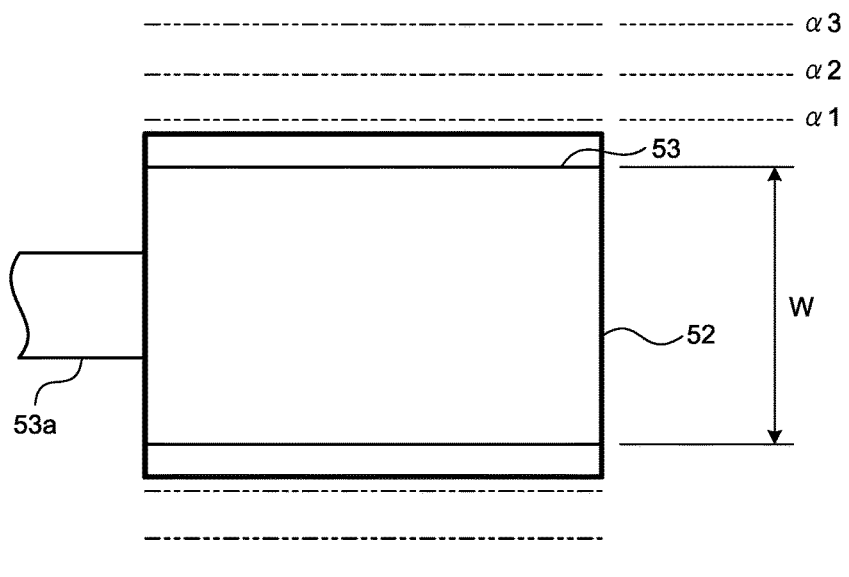
FIG. 8 is a view illustrating an example of a solder application method.

Next, an example of a method of applying the solder 52 will be described with reference to FIGS. 7 and 8. FIG. 7 is a view illustrating an example of the electrode 53 of the substrate (FPC) 12. FIG. 8 is a view illustrating an example of the method of applying the solder 52. Herein, FIGS. 7 and 8 illustrate a case where the FPC 12 is viewed in the arrow D1 direction in FIG. 2.

As illustrated in FIG. 7, for example, the electrode 53 of the FPC 12 has a rectangular electrode shape, and the plurality of electrodes 53 are provided side by side in the longitudinal direction of the surface on which the LED 14 is mounted. Herein, the electrode 53 of the FPC 12 is connected so as to be conductive via a small width portion 53a between the neighboring LEDs 14. In addition, the electrode 50 of the LED 14 has a shape identical to that of the electrode 53 of the FPC 12 and has a size to fit within the mounting surface of the LED 14 in the FPC 12.

As illustrated in FIG. 8, the solder 52 is applied to the electrode 53 of the FPC 12 so as to protrude above the mounting surface from the electrode 53 in the process of applying the solder 52. Herein, the solder 52 is applied by widening a range so as to protrude above the mounting surface by forming the opening of the metal mask to be larger than a width W of the electrode 53 of the FPC 12. Herein, the solder 52 may be applied so as to protrude also in a depth direction of the electrode 53 (a direction orthogonal to the width W).

As a large amount of the solder 52 is applied so as to protrude above the mounting surface from the electrode 53 in this manner, the molten solder 52 is agglomerated in a space between the electrode 50 of the LED 14 and the electrode 53 of the FPC 12 in the reflow process of the solder 52. In addition, it is possible to perform the more favorable solder bonding even if the application range of the solder 52 is widened from the electrode 53 in one direction (the width W direction) of the electrode 53 by α1, α2, and α3 [μm].

Herein, the FPC 12 is, for example, the polyimide substrate as described above. Thus, even when the solder 52 protrudes on the mounting surface of the FPC 12, the solder 52 moves to the electrode 53 side during the reflow so that the solder 52 hardly remains on the mounting surface.

In this manner, since the space between the LED 14 and the FPC 12 is filled with the solder 52 even if the volume of the solder 52 at the time of reflow decreases, it is possible to stabilize the bonding between the LED 14 and the FPC 12 in the method of applying the solder 52 according to the embodiment. Accordingly, it is possible to mount the LED 14 on the FPC 12 with high accuracy. As a result, it is possible to obtain the excellent brightness characteristics while meeting a demand for reduction in thickness.

Another Example of Solder Application Method

Figure 9:
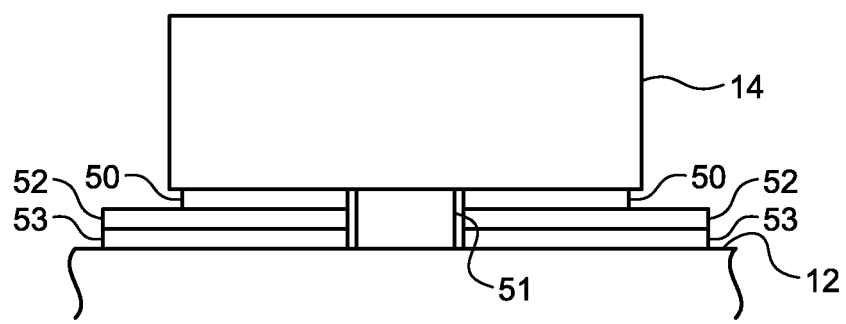
FIG. 9 is a view illustrating another example of the solder application method.
Figure 9:
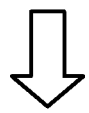
Figure 9:
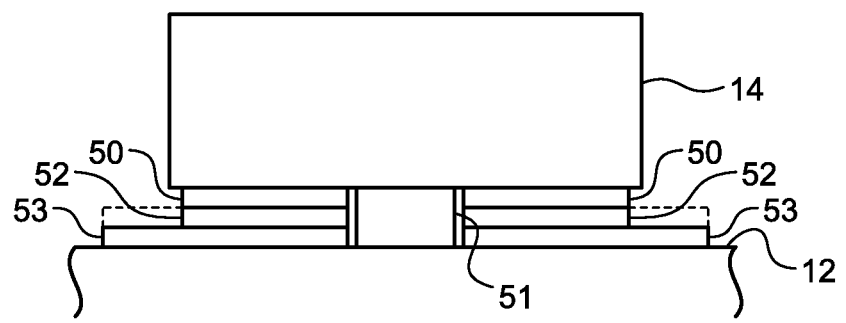

Next, another example of the method of applying the solder 52 will be described with reference to FIGS. 9 to 10C. FIG. 9 is a view illustrating another example of the method of applying the solder 52. FIGS. 10A to 10C are schematic views illustrating the electrode 53 of the substrate (FPC) 12 with respect to the electrode 50 of the light source (LED) 14. Herein, FIG. 9 illustrates a state of the solder 52 in Steps 3 and 4 in FIG. 6. In addition, FIGS. 10A to 10C illustrate the side surface (viewed in the arrow D1 direction in FIG. 2) of the LED 14 in the mounted state and do not illustrate the parts other than the respective electrodes 50 and 53 of the LED 14 and the FPC 12. In addition, the electrode 50 of the LED 14 is illustrated to be smaller than the electrode 53 of the FPC 12 in FIGS. 10A to 10C in order to facilitate the understanding of the drawings. In practice, however, a side of the electrode 50 of the LED 14 and a side of the electrode 53 of the FPC 12 may overlap each other, or the electrode 50 of the LED 14 may be slightly larger.

As illustrated in FIG. 9, the electrode 53 of the FPC 12 may be formed to be wider in the bonding surface direction than the electrode 50 of the LED 14. Herein, the electrode 50 of the LED 14 has a size to fit within the mounting surface of the LED 14 in the FPC 12.

The solder 52 is applied to the entire surface of the electrode 53 with respect to the electrode 53 of the FPC 12 in the process of applying the solder 52, and as a result, the solder 52 is applied to a wider range than the electrode 50 of the LED 14. Herein, the electrode 53 of the FPC 12 may be formed so as to be wider than the electrode 50 of the LED 14 only in one direction (depth direction) of the bonding surface, or may be formed to wider in a direction (direction perpendicular to the depth direction) other than the one direction of the bonding surface.

Figure 10A:
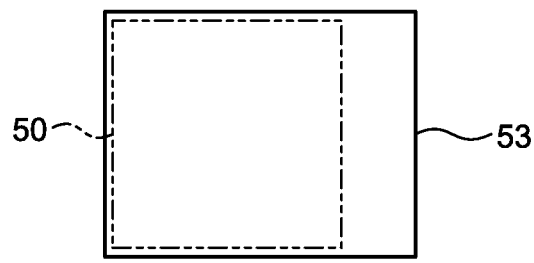
FIG. 10A is a schematic view (Part 1) illustrating the electrode of the substrate with respect to an electrode of the light source.
Figure 10B:
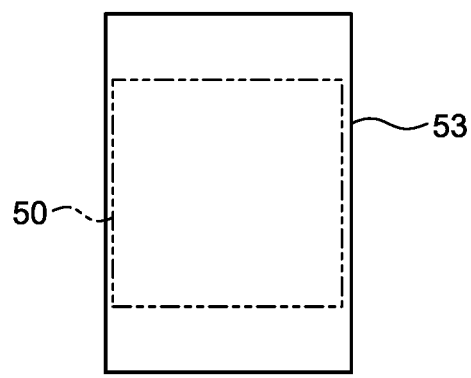
FIG. 10B is a schematic view (Part 2) illustrating the electrode of the substrate with respect to the electrode of the light source.
Figure 10C:
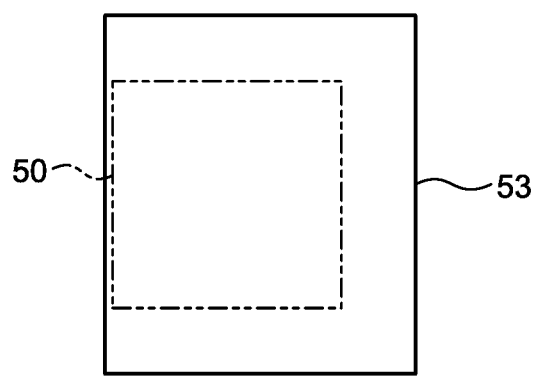
FIG. 10C is a schematic view (Part 3) illustrating the electrode of the substrate with respect to the electrode of the light source.

As illustrated in FIG. 10A, the electrode 53 of the FPC 12 may be formed to be widened toward one side in the depth direction with respect to the electrode 50 of the LED 14, for example. In addition, the electrode 53 of the FPC 12 may be formed so as to be widened toward both of one side and the other side in the direction (width direction) orthogonal to the depth direction with respect to the electrode 50 of the LED 14 as illustrated in FIG. 10B. In addition, the electrode 53 of the FPC 12 may be formed so as to be widened toward the one side in the depth direction and both of the one side and the other side in the width direction with respect to the electrode 50 of the LED 14 as illustrated in FIG. 10C.

Herein, the solder 52 is applied while widening the application range by forming the opening of the metal mask to be large even in another example. In addition, the amount of the solder 52 to be applied increases as the solder 52 is applied to the electrode 53 which is wider in the bonding surface direction than the electrode 50 of the LED 14, and the molten solder 52 is agglomerated in the space between the electrode 50 of the LED 14 and the electrode 53 of the FPC 12 in the reflow process of the solder 52.

Since the space between the LED 14 and the FPC 12 is filled with the solder 52 even if the volume of the solder 52 at the time of reflow decreases, it is possible to stabilize the bonding between the LED 14 and the FPC 12 even in the method of applying the solder 52 according to another example. Accordingly, it is possible to mount the LED 14 on the FPC 12 with high accuracy. As a result, it is possible to obtain the excellent brightness characteristics while meeting a demand for reduction in thickness.

Process of Assembling Planar Illumination Device

Figure 11:
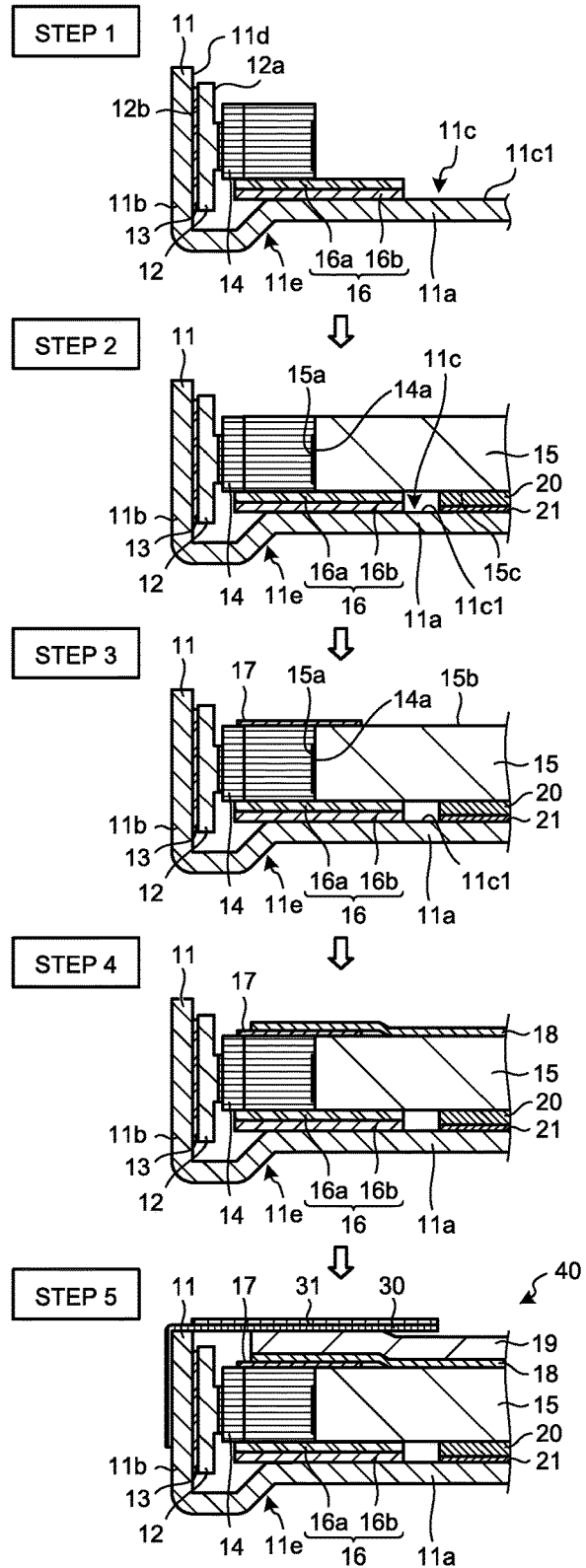
FIG. 11 is a view for explaining an example of a process of assembling the planar illumination device.

Next, a process of assembling the planar illumination device 10 will be described with reference to FIG. 11. FIG. 11 is a view for explaining an example of the process of assembling the planar illumination device 10. Herein, a cross section illustrated in FIG. 11 is a cross section including the light emitting surface 14a of the LED 14.

As illustrated in FIG. 11, the LED 14 is first mounted on the main surface 12a of the FPC 12 in Step 1. Then, the coupling member 16 is attached to at least a part of the surface of the LED 14 on the floor surface 11c side. Further, the main surface 12b of the FPC 12 is fixed to the side surface 11d of the frame 11 using the connection member 13.

For example, the coupling member 16 is placed on the flat surface 11c1 of the floor surface 11c. Further, the FPC 12 and the LED 14 are moved toward the side surface 11d such that the coupling member 16 slides on the flat surface 11c1 of the floor surface 11c. Further, the main surface 12b of the FPC 12 is fixed to the side surface 11d using the connection member 13.

In this manner, it is possible to fix the FPC 12 to the side surface 11d using the simple method of placing the coupling member 16 on the flat surface 11c1 of the floor surface 11c and moving the FPC 12 and the LED 14 toward the side surface 11d such that the coupling member 16 slides on the flat surface 11c1 of the floor surface 11c according to the embodiment.

Herein, a description will be given assuming a case where the coupling member 16 can adhere on both sides. In this case, when the coupling member 16 is placed on the flat surface 11c1 of the floor surface 11c in Step 1, the coupling member 16 is bonded to the flat surface 11c1 of the floor surface 11c.

Accordingly, it is difficult to move the FPC 12 and the LED 14 toward the side surface 11d such that the coupling member 16 slides on the flat surface 11c1 of the floor surface 11c. Therefore, when the coupling member 16 can adhere to both the sides, it is difficult to fix the main surface 12b to the side surface 11d using the connection member 13 in the simple method as in the embodiment.

However, only one side of the coupling member 16 on which the fixing member 16b is arranged can adhere according to the embodiment as described above, and thus, it is possible to fix the FPC 12 to the side surface 11d in the simple method.

In Step 2, the alignment between the optical axis of the light guide plate 15 and the optical axis of the LED 14 (alignment between the surface of the LED 14 on the floor surface 11c side and the back surface 15c of the light guide plate 15) is performed using the flat surface 11c1 of the floor surface 11c as a positioning reference in the thickness direction.

Further, at least part of the back surface 15c of the light guide plate 15 is attached to the coupling member 16 in the state where the two optical axes coincide with each other. Accordingly, the light guide plate 15 is fixed to the LED 14 in the state where the optical axis of the light guide plate 15 coincides with the optical axis of the LED 14 and the side surface 15a of the light guide plate 15 is coupled with the light emitting surface 14a of the LED 14.

Therefore, the accuracy in alignment between the optical axes of the light guide plate 15 and the LED 14 is improved according to the embodiment. Therefore, it is possible to stabilize the brightness characteristics, such as brightness and brightness distribution, at a high level in the planar illumination device 10 according to the embodiment.

In addition, it is possible to meet the demand for reduction in thickness since the thickness of the coupling member 16 coupling the light guide plate 15 with the LED 14 is small according to the embodiment. From the above, it is possible to provide the excellent brightness characteristics while meeting the demand for reduction in thickness according to the embodiment.

In addition, the reflection sheet 20 may be fixed on the flat surface 11c1 of the floor surface 11c using the double-sided tape 21 when attaching the light guide plate 15 to the coupling member 16 in Step 2.

In Step 3, one surface of the connection member 17, which is the double-sided tape, is bonded to at least a part of the main surface 15b of the light guide plate 15 close to the LED 14 and is bonded to at least a part of the surface of the LED 14 opposite to the floor surface 11c close to the light guide plate 15. Accordingly, the connection member 17 can couple the side surface 15a of the light guide plate 15 with the light emitting surface 14a of the LED 14.

In Step 4, at least a part of the diffusion sheet 18 on the side wall portion 11b side is bonded to the other surface of the connection member 17.

In Step 5, the prism sheet 19 is arranged on a side opposite to the light guide plate 15 with respect to the diffusion sheet 18. In addition, the portion on one end side of the first light shielding sheet 30, which is the single-sided tape, is bonded to the outer surface of the side wall portion 11b of the frame 11 in Step 5.

Further, the surface on the prism sheet 19 side of the portion on the other end side of the first light shielding sheet 30 is bonded to a part of the side wall portion 11b side of the prism sheet 19 in Step 5. Then, one surface between the two surfaces of the second light shielding sheet 31, which is the double-sided tape, is bonded to the portion on the other end side of the first light shielding sheet 30 in Step 5. Through Steps 1 to 5, the planar illumination device 10 according to the embodiment is completed.

Although the case where the LED 14 is the top view type LED has been described in the above-described embodiment, for example, the LED 14 may be a so-called side view type LED in which a surface different from the light emitting surface 14a, that is, the surface along a direction orthogonal to the direction along the light emitting surface 14a is a bonding surface and the bonding surface is bonded to the FPC 12 by the fixing member 51.

According to one aspect of the present invention, it is possible to obtain excellent brightness characteristics while meeting a demand for reduction in thickness.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A planar illumination device comprising:
   a light guide plate that causes light incident on a side surface thereof to exit from an light exit surface thereof;

a light source that is arranged to face the side surface of the light guide plate and has a light emitting surface to emit light toward the side surface;

a substrate on which the light source is mounted by bonding a bonding surface of the light source thereto by a solder; and a fixing member that is cured at temperature lower than a melting point of the solder and fixes the light source to the substrate while maintaining a position and a posture of the light source when the solder is melted, the fixing member being located between the light source and the substrate, wherein the fixing member does not protrude from both end portions of the light source in a longitudinal direction in a top view, wherein said top view corresponds to a viewing direction of a top surface of the light source.

2. The planar illumination device according to claim 1, wherein the fixing member is arranged at both end portions in a thickness direction at substantially a center in a longitudinal direction of the light source on the bonding surface.

3. The planar illumination device according to claim 2, wherein the fixing member is a thermosetting adhesive and protrudes outward from a surface of the light source opposite to the light emitting surface.

4. The planar illumination device according to claim 1, further comprising a spacer provided between the fixing member and the substrate, or provided between the light source and the fixing member.

5. The planar illumination device according to claim 4, wherein the light source includes an electrode on the bonding surface, and the spacer is formed by extending the electrode.

6. The planar illumination device according to claim 4, wherein the light source has a conductor different from an electrode on the bonding surface, and the spacer is formed by the conductor.

7. The planar illumination device according to claim 4, wherein the substrate has a conductor different from an electrode on a surface on which the light source is mounted, and the spacer is formed by the conductor.

8. The planar illumination device according to claim 7, wherein an electrode of the substrate is wider in a direction of the bonding surface than an electrode of the light source.

9. The planar illumination device according to claim 1, wherein the light source is formed into a rectangular parallelepiped shape and has a shape in which an aspect ratio of dimensions that are a height and a width is one or higher.

10. The planar illumination device according to claim 1, wherein the light source has the bonding surface on a surface opposite to the light emitting surface.

11. The planar illumination device according to claim 1, wherein a plurality of the light sources are arranged such that neighboring light sources are adjacent to each other.

12. The planar illumination device according to claim 1, wherein no fillet of the solder is formed on a pair of side surfaces in the longitudinal direction of the light source.

13. The planar illumination device according to claim 1, wherein no coverlay film is disposed on the surface of the substrate on which the light source is mounted.

14. The planar illumination device according to claim 1, wherein the fixing member is formed between a plurality of electrodes, the electrodes being formed along a longitudinal direction of the substrate.

15. A method of manufacturing the planar illumination device, wherein the planar illumination device includes:

a light guide plate that causes light incident on a side surface thereof to exit from an light exit surface thereof;

a light source that is arranged to face the side surface of the light guide plate and has a light emitting surface to emit light toward the side surface;

a substrate on which the light source is mounted by bonding a bonding surface of the light source thereto by a solder; and a fixing member that is cured at temperature lower than a melting point of the solder and fixes the light source to the substrate while maintaining a position and a posture of the light source when the solder is melted, the fixing member being located between the light source and the substrate, wherein the fixing member does not protrude from both end portions of the light source in a longitudinal direction in a top view, wherein said top view corresponds to a viewing direction of a top surface of the light source, and the method comprising:

raising temperature to cure the fixing member arranged on the substrate at lower temperature than a melting point of the solder; and further raising the temperature to be equal to or higher than the melting point of the solder to melt the solder.

16. The method of manufacturing the planar illumination device according to claim 15, further comprising applying the solder to the electrode having a shape equivalent to the electrode of the light source on the substrate so as to protrude from the electrode of the substrate.

17. The method of manufacturing the planar illumination device according to claim 15, further comprising applying the solder to the electrode, which is wider in a direction of the bonding surface than the electrode of the light source on the substrate, in a wider region than the electrode of the light source.

* * * * *